United States Patent
Yin et al.

(10) Patent No.: US 12,349,584 B2
(45) Date of Patent: Jul. 1, 2025

(54) ORGANIC-INORGANIC PEROVSKITE SOLAR CELL WITH DIRECTIONAL ARRANGEMENT OF INTRINSIC PEROVSKITE DIPOLES AND PREPARATION METHOD THEREOF

(71) Applicant: Shandong University, Jinan (CN)

(72) Inventors: Longwei Yin, Jinan (CN); Yutong Wu, Jinan (CN)

(73) Assignee: Shandong University, Jinan (CN)

( * ) Notice: Subject to any disclaimer, the term of this patent is extended or adjusted under 35 U.S.C. 154(b) by 0 days.

(21) Appl. No.: 18/456,534

(22) Filed: Aug. 28, 2023

(65) Prior Publication Data

US 2024/0114759 A1  Apr. 4, 2024

(30) Foreign Application Priority Data

Sep. 27, 2022 (CN) .......................... 202211185105.X

(51) Int. Cl.
| | |
|---|---|
| H10K 71/10 | (2023.01) |
| H10K 30/50 | (2023.01) |
| H10K 30/82 | (2023.01) |
| H10K 30/85 | (2023.01) |
| H10K 30/86 | (2023.01) |
| H10K 71/13 | (2023.01) |
| H10K 71/40 | (2023.01) |
| H10K 85/50 | (2023.01) |
| H10K 85/60 | (2023.01) |

(52) U.S. Cl.
CPC ........... *H10K 71/191* (2023.02); *H10K 30/50* (2023.02); *H10K 71/13* (2023.02); *H10K 71/40* (2023.02); *H10K 30/82* (2023.02); *H10K 30/85* (2023.02); *H10K 30/86* (2023.02); *H10K 85/50* (2023.02); *H10K 85/624* (2023.02); *H10K 85/633* (2023.02)

(58) Field of Classification Search
CPC .................................................... H10K 71/191
See application file for complete search history.

(56) References Cited

PUBLICATIONS

Girolamo (Year: 2021).*
Wang (Year: 2021).*
Zhou (Year: 2022).*
Xu (Year: 2020).*

* cited by examiner

*Primary Examiner* — Sadie White
(74) *Attorney, Agent, or Firm* — Tutunjian & Bitetto, P.C.

(57) ABSTRACT

An organic-inorganic perovskite solar cell with directional arrangement of intrinsic perovskite dipoles is provided, and includes a conductive substrate, an electron transport layer, a perovskite film with directional arrangement of intrinsic dipoles, a hole transport layer and a metal counter electrode arranged from bottom to top; or the conductive substrate, the perovskite film with directional arrangement of intrinsic dipoles, the hole transport layer and the metal counter electrode arranged from bottom to top; a preparation method of the perovskite film includes: adding sulfonamide into perovskite precursor solution, and evenly mixing; spin coating on the electron transport layer or the conductive substrate and annealing. Volatile and high-polar molecule sulfonamide is used as an initiator for directional arrangement of intrinsic perovskite dipoles to induce reorientation of perovskite dipoles, thus achieving vertical directional polarization of the perovskite film, and effectively improve photoelectric conversion efficiency and stability of solar cells.

12 Claims, 4 Drawing Sheets

ORGANIC-INORGANIC PEROVSKITE SOLAR CELL WITH DIRECTIONAL ARRANGEMENT OF INTRINSIC PEROVSKITE DIPOLES AND PREPARATION METHOD THEREOF

TECHNICAL FIELD

The disclosure relates to the technical field of perovskite solar cells, and more particularly to an organic-inorganic perovskite solar cell with directional arrangement of intrinsic perovskite dipoles and a preparation method thereof.

BACKGROUND

Organic-inorganic hybrid perovskite becomes one of the most promising semiconductor materials due to its advantages such as a large absorption coefficient, an adjustable bandgap, a low cost, and easy preparation. Until now, a highest certified photoelectric conversion efficiency of a perovskite solar cell reaches 26.1 percent (%), which is comparable to a high-performance silicon-based solar cell. However, due to a perovskite film prepared by a solution method has a polycrystalline property, an electron or a hole is attracted by defects with a positive or negative charge in a crystal boundary, and a surface of the perovskite film under a coulomb interaction, which cannot avoid causing severe non-radiative recombination. Therefore, an enhancement of directional extraction and transmission capacity of a carrier is a necessary pathway for suppressing an open-circuit voltage loss and maintaining a long-term efficient and stable output of a perovskite device.

A research based on methylamine-based hybrid perovskite shows that rotation of a methylamine ion with a strong dipole moment in a crystal lattice will form a local spontaneous polarization within the perovskite film, and a change of a local electrostatic field is caused to affect the transmission of the carrier. However, an orientation of localized polarization in the perovskite is usually unordered, which makes the perovskite film show a minimal macroscopic net polarization and a nearly flat energy band. In one aspect, the nearly flat energy band is not conducive to directional transportation for extracting the carrier in a photoactive layer to cause an unnecessary quenching of an intra-layer photogenerated carrier. In another aspect, energy levels between a perovskite layer and an electron transport layer are not matched, which exacerbates recombination in an interface and limits a further improvement of performance. Moreover, preparation of the electron transport layer in a perovskite device needs a high-temperature and complex process preparation, perovskite cell devices without the electron transport layer have more competitive in the commercialization of the perovskite solar cell due to their advantages such as a low manufacturing cost and a high application flexibility, however, severe recombination is caused by an energy level mismatch between the perovskite layer and a conductive substrate, and photoelectric conversion efficiencies of the perovskite solar cells without the electron transport layer is low.

In order to solve the above problems, the disclosure is proposed.

SUMMARY

In order to solve problems of a perovskite solar cell such as mismatched energy level at interface and low carrier extraction efficiency, the disclosure provides an organic-inorganic perovskite solar cell with directional arrangement of intrinsic perovskite dipoles and a preparation method thereof. A volatile inorganic molecule sulfamide is used as an initiator for directional arrangement of intrinsic perovskite dipoles in the disclosure, and reorientation of perovskite dipoles determines the vertical polarization of a perovskite film. A gradient energy band structure of the light absorption layer and the matched energy level alignment at interfaces of the perovskite solar cells is induced by dipoles with the vertical arrangement, a built-in electric field is effectively enhanced, and non-radiative recombination is effectively suppressed. Moreover, exciton binding energy is significantly reduced by a change of a local dielectric field of the perovskite film after the directional arrangement of intrinsic perovskite dipoles, which is conducive to efficient extraction and transportation of the carrier. Photoelectric conversion efficiencies and stability of the organic-inorganic perovskite solar cell are effectively improved by the above regulation of the perovskite film of the disclosure.

Technical solutions for the disclosure are as follows.

An organic-inorganic perovskite solar cell with directional arrangement of intrinsic perovskite dipoles is provided, and the organic-inorganic perovskite solar cell with directional arrangement of intrinsic perovskite dipoles includes: a conductive substrate, an electron transport layer, a perovskite film with directional arrangement of intrinsic dipoles, a hole transport layer, and a metal counter electrode, which are sequentially arranged from bottom to top; and a preparation method of the perovskite film with directional arrangement of intrinsic dipoles comprises: adding sulfamide ($SO_2(NH_2)_2$) into a precursor solution of perovskite and evenly mixing to obtain a spin-coating solution, spin coating the spin-coating solution on the electron transport layer, and performing a first annealing treatment to obtain the perovskite film with directional arrangement of intrinsic dipoles; or the organic-inorganic perovskite solar cell with directional arrangement of intrinsic perovskite dipoles includes: the conductive substrate, the perovskite film with directional arrangement of intrinsic dipoles, the hole transport layer, and the metal counter electrode, which are sequentially arranged from bottom to top; and the preparation method of the perovskite film with directional arrangement of intrinsic dipoles includes: adding sulfamide ($SO_2(NH_2)_2$) into the precursor solution of perovskite and evenly mixing to obtain the spin-coating solution; spin coating the spin-coating solution on the conductive substrate, and performing the first annealing treatment to obtain the perovskite film with directional arrangement of intrinsic dipoles.

In an embodiment, preparations of the conductive substrate, the electron transport layer, the hole transport layer, and the metal counter electrode can be based on the related art.

In an embodiment, the conductive substrate is a transparent conductive substrate with fluorine-doped tin oxide (FTO), and a thickness of the conductive substrate is in a range of 140-160 nanometers (nm).

In an embodiment, a material of the electron transport layer is tin dioxide ($SnO_2$), and a thickness of the electron transport layer is in a range of 30-50 nm.

In an embodiment, a material of the hole transport layer is 2,2',7,7'-tetrakis-[N,N-di(4-methoxyphenyl) amino]-9,9'-spirobifluorene (spiro-OMeTAD), and a thickness of the hole transport layer is in a range of 200-250 nm.

In an embodiment, the metal counter electrode is a silver (Ag) counter electrode, and a thickness of the metal counter electrode is in a range of 100-140 nm.

In an embodiment, a thickness of the perovskite film with directional arrangement of intrinsic dipoles is in a range of 550-600 nm, the perovskite film with directional arrangement of intrinsic dipoles has a gradient energy band structure and transits from a p-type semiconductor to a n-type semiconductor from top to bottom in the gradient energy band structure.

In an embodiment, a preparation method of the precursor solution of perovskite includes dissolving single-crystal powders of formamidinium lead iodide ($FAPbI_3$) and methylammonium chloride (MACl) in a mixed solvent of N, N-dimethylformamide ($C_3H_7NO$) and dimethyl sulfoxide ($C_2H_6OS$) to obtain the precursor solution of perovskite; and a mole ratio of the $FAPbI_3$ powder and the MACl is 1:0.35; in the mixed solvent, a volume ratio of the N, N-dimethylformamide and the dimethyl sulfoxide is 3-5:1; and a concentration of the $FAPbI_3$ powder in the mixed solvent is in a range of 1.6-1.8 moles per liter (mol/L).

In an embodiment, a preparation method of the single-crystal powders of $FAPbI_3$ includes: mixing lead acetate (($CH_3COO)_2Pb$) with formamidine acetate ($C_3H_8N_2O_2$) in a mole ratio of 3:4 and adding in a hydroiodic acid (HI) aqueous solution, keeping a temperature of 80-90 Celsius degree (° C.) for 2-4 hours (h), and performing a washing treatment and a second annealing treatment to obtain the single-crystal powders of $FAPbI_3$; and a concentration of the hydroiodic acid aqueous solution is in a range of 55-58 weight percent (wt %); a temperature of the second annealing treatment is in a range of 150-180° C., and a period of the second annealing treatment is in a range of 12-24 h.

In an embodiment, a mole ratio of the sulfamide and the formamidinium lead iodide in the precursor solution of perovskite is 0.02-0.08:1, specifically, the mole ratio of the sulfamide and the formamidinium lead iodide in the precursor solution of perovskite is 0.04:1.

In an embodiment, a speed for spin coating the spin-coating solution is in a range of 5000-6000 revolutions per minute (rpm) and a period for spin coating the spin-coating solution is in a range of 40-50 seconds (s); and an ether ($C_2H_5OC_2H_5$) antisolvent is added when the spin coating is performed for 10 s, and a volume ratio of the ether antisolvent and the spin-coating solution is 10-13:1.

In an embodiment, a temperature of the first annealing treatment is in a range of 100-160° C., a period of the first annealing treatment is in a range of 10-15 minutes (min); specifically, the temperature of the first annealing treatment is in a range of 140-160° C.

In an embodiment, the spin coating and the first annealing treatment are performed in an atmosphere with a protective gas; and the protective gas is nitrogen.

In an embodiment, the perovskite film with directional arrangement of intrinsic dipoles is a formamidinium lead iodide perovskite or methylammonium lead iodide perovskite.

A preparation method for the above organic-inorganic perovskite solar cell with directional arrangement of intrinsic perovskite dipoles is provided, and the method includes:
step 1: pretreating the conductive substrate;
step 2: preparing the electron transport layer on the conductive substrate, and preparing the perovskite film with directional arrangement of intrinsic dipoles on the electron transport layer; or directly preparing the perovskite film with directional arrangement of intrinsic dipoles on the conductive substrate;
step 3: preparing the hole transport layer on the perovskite film with directional arrangement of intrinsic dipoles;
step 4: preparing the metal counter electrode on the hole transport layer.

In an embodiment, the conductive substrate in step 1, the electron transport layer in step 2, the hole transport layer in step 3, and the metal counter electrode in step 4 can be prepared based on the related art.

In an embodiment, in step 1, a method for the pretreating the conductive substrate includes: sequentially performing an ultrasonic cleaning process on the conductive substrate in deionized water, isopropanol ($C_3H_8O$), and ethanol ($CH_3CH_2OH$), and performing blow-drying with nitrogen; and performing an ultraviolet ozone treatment on the conductive substrate; where a period of the ultrasonic cleaning process for each of the deionized water, the isopropanol, and the ethanol is in a range of 10-20 min, and a period of the ultraviolet ozone treatment is in a range of 10-30 min.

In an embodiment, in step 2, a method for the preparing the electron transport layer on the conductive substrate includes: submerging the conductive substrate in a mixed aqueous solution of hydrochloric acid (HCl), urea (CO($NH_2)_2$), thioglycolic acid ($C_2H_4O_2S$) and tin (II) chloride dihydrate ($SnCl_2·2H_2O$), and performing a washing treatment, a drying treatment and a third annealing treatment to obtain the electron transport layer.

In an embodiment, a concentration of the urea in the mixed aqueous solution is in a range of 12-13 milligrams per milliliter (mg/mL), a concentration of the hydrochloric acid is in a range of 12-13 microliters per milliliter ($\mu$L/mL) and with a mass fraction of 37 wt %, a concentration of the thioglycolic acid is in a range of 0.2-0.3 $\mu$L/mL, and a concentration of $SnCl_2·2H_2O$ is in a range of 2.5-3 mg/mL; a temperature for the submerging is in a range of 85-95° C., a period for the submerging is in a range of 5-6 h, a temperature of the third annealing treatment is in a range of 160-180° C., a period of the third annealing treatment is in a range of 30-60 min, and an atmosphere of the third annealing treatment is air.

In an embodiment, in step 3, a method for the preparing the hole transport layer includes: mixing spiro-OMeTAD, chlorobenzene ($C_6H_5Cl$), 4-tert-butylpyridine ($C_9H_{13}N$), a solution of lithium bis(trifluoromethanesulfonyl)imide (LiN($SO_2CF_3)_2$) in acetonitrile, and a solution of [4-tert-butyl-2-(1H-pyrazole-1-yl) pyridine] cobalt (III) ($Co(C_{12}H_{15}N_3)_3$) in acetonitrile and performing stirring for dissolving to obtain a doped spiro-OMeTAD solution, spin coating the doped spiro-OMeTAD solution on the perovskite film with directional arrangement of intrinsic dipoles, and drying the doped spiro-OMeTAD solution to obtain the hole transport layer; and a ratio of a mass of the spiro-OMeTAD and a volume of the chlorobenzene is 90:1 mg/mL, a concentration of the solution of lithium bis(trifluoromethanesulfonyl) imide in acetonitrile is in a range of 500-540 mg/mL, a concentration of the solution of [4-tert-butyl-2-(1H-pyrazole-1-yl) pyridine] cobalt (III) in acetonitrile is in a range of 350-400 mg/mL, a volume ratio of the chlorobenzene:the 4-tert-butylpyridine:the solution of lithium bis(trifluoromethanesulfonyl)imide in acetonitrile: the solution of [4-tert-butyl-2-(1H-pyrazole-1-yl) pyridine] cobalt (III) in acetonitrile is 1000:39:23:10; a speed for spin coating the doped spiro-OMeTAD solution is in a range of 3000-4000 rpm, and a period for spin coating the doped spiro-OMeTAD solution is in a range of 20-30 s.

In an embodiment, in step 4, a method for the preparing the metal counter electrode includes: depositing the metal counter electrode on the hole transport later by using a thermal evaporation with an evaporation rate of 0.1-0.8 angstroms per second (Å/s) under a vacuum degree being smaller than $1 \times 10^{-4}$ pascal (Pa).

Technical features and beneficial effects of the disclosure are as follows.

1. The volatile inorganic molecule sulfamide is used as an initiator in the disclosure to adjust a perovskite crystallization, the initiator is changed from an amide state to a polar state under the induction of a polar solvent, and the initiator has an extremely strong molecular dipole moment.

Therefore, the initiator is added to the precursor solution of perovskite to induce the intrinsic dipoles of the perovskite film to directionally arrange. All most of existed sulfonamide analogues used for modifying the perovskite are organic additives at present, which passivates defects of the perovskite film by a Lewis acid-base coordination to improve the performance of a perovskite device, thereby an added additive remains in a final formed perovskite film, and a molecule with low dielectric constant introduced from this is not conducive to effective collection of the carrier under the long-term stable operation of the perovskite device. However, the sulfamide used in the disclosure is an inorganic molecule, which will completely evaporate from the perovskite film after performing the annealing treatment on the perovskite film, and not have adverse effects on the performance of the perovskite device; moreover, a mechanism of the sulfamide is to induce a directional arrangement of the intrinsic perovskite dipoles, and further excite an intrinsic advantage of the perovskite film.

2. Vertical orientation rearrangement of the intrinsic perovskite dipoles is effectively induced by a crystallization process of a polar molecule used in the disclosure, compared to a commonly used method of induced bias voltage, and irreversible damage for the perovskite film caused by an external electric field is avoided by the strategy. The perovskite film with high crystallinity is obtained while the strategy induces the directional polarization.

3. The disclosure aims to further excite superiority of the perovskite itself, a key point of the disclosure is to successfully induce directional arrangement of the intrinsic dipoles in the perovskite film, and the energy band structure of the perovskite device is optimized by vertically arranged dipoles, which is a key for improving the performance of the perovskite device; directional arrangement of the intrinsic perovskite dipoles is successfully induced by introducing a volatile molecule with a strong polarity in the disclosure; the energy band structure of the perovskite is effectively optimized, and the energy band structure is a key for extracting and transporting the carrier in the perovskite device; a gradient energy band structure of the perovskite film is successfully regulated by the disclosure, a direction of the generated electric field is consistent with the built-in electric field, the efficient extraction and transportation of the carrier is promoted by the enhanced built-in electric field, which can be effectively applied in the perovskite solar cell and other photovoltaic devices.

4. The local dielectric field within the perovskite film is changed by redirecting dipoles in the disclosure, so as to effectively reduce the exciton binding energy, enhance the mobility of the carrier, extend the lifetime of the carrier, and obtain an ultralong diffusion distance of the carrier greater than 1700 nm.

5. A carrier dynamic of the perovskite solar cell is improved by rearrangement of the dipoles in the disclosure, and an obtained photoelectric conversion efficiency of an n-i-p structure based on a tin dioxide electron transport layer is improved from 22.3 percent (%) to 24.63%; and the obtained photoelectric conversion efficiency has good stability. The unencapsulated devices maintain over 92% of the initial efficiency after 1080 h of storage in ambient conditions.

6. The preparation of the electron transport layer in the perovskite device needs a high-temperature and complex preparation, therefore, a perovskite cell device without the electron transport layer has more competitive in commercialization of the perovskite solar cell, however, due to an energy level mismatch between the perovskite layer and interfaces of the conductive substrate, the photoelectric conversion efficiency of the perovskite solar cell without the electron transport layer is still low. The disclosure prepares the perovskite solar cell without the electron transport layer, due to the gradient energy band structure induced by the directional arrangement of the intrinsic dipoles, modifying the energy band of the interface, and accelerating the efficient extraction and transportation of the carrier, the photoelectric conversion efficiency of the perovskite solar cell without the electron transport layer reaches 20.37%, which is one of the highest efficiencies of perovskite solar cells without the electron transport layer.

DETAILED DESCRIPTION OF EMBODIMENTS

Figure 1:
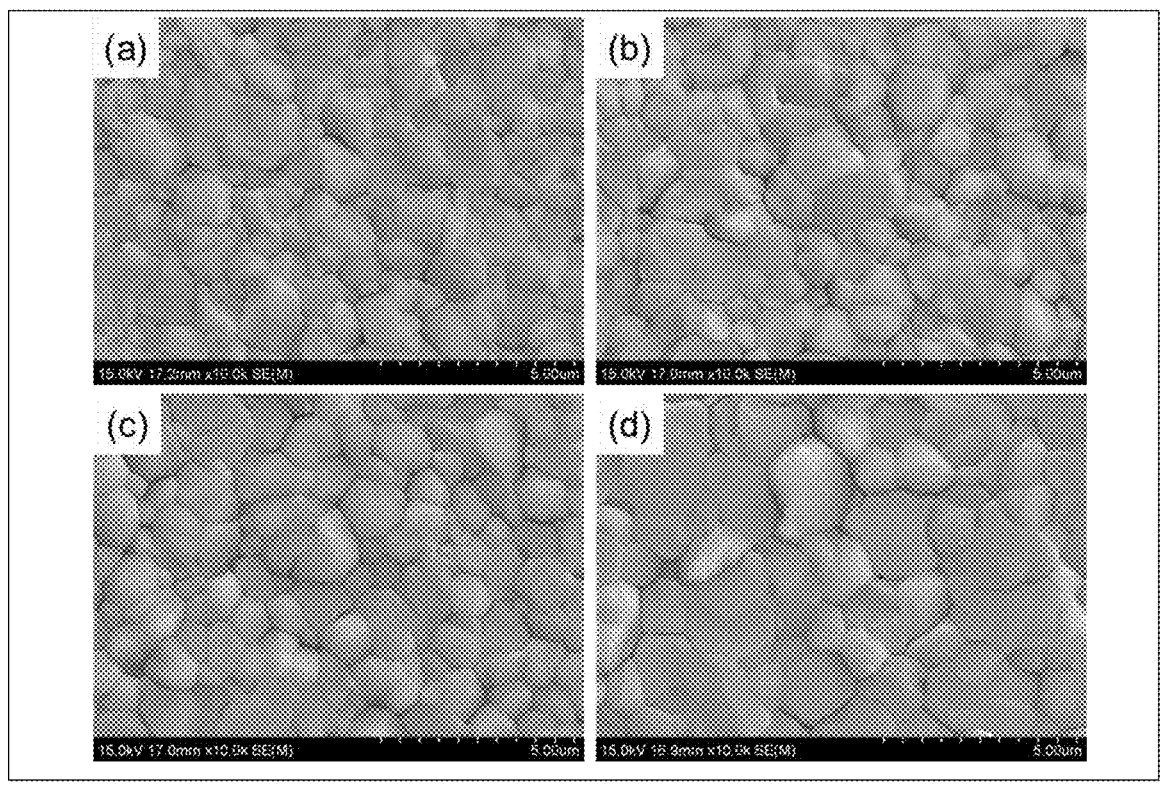
FIG. 1 illustrates scanning electron microscope (SEM) diagrams of organic-inorganic perovskite films, in which (a), (b), (c), and (d) respectively correspond to the organic-inorganic perovskite films prepared in a comparative embodiment 1, an embodiment 3, an embodiment 1, and an embodiment 4 of the disclosure.

The disclosure will be further described in conjunction with embodiments, but not limited to them.

Unless otherwise specified, raw materials used in the embodiments are all conventional and commercially available; unless otherwise specified, methods used in the embodiments, are all the related art.

Embodiment 1

A preparation method of organic-inorganic perovskite solar cells with directional arrangement of intrinsic perovskite dipoles is provided, and the method includes the following steps 1-5.

In step 1, an ultrasonic cleaning process is performed on a fluorine-doped tin oxide (FTO) transparent conductive substrate (a length×width is 19×24 square millimeters ($mm^2$), and a thickness is 150 nanometers (nm)) sequentially in deionized water, isopropanol ($C_3H_8O$) and ethanol ($CH_3CH_2OH$) solution. A period of the ultrasonic cleaning process for each of the deionized water, the isopropanol, and the ethanol is 15 minutes (min), blow-drying is performed on the conductive substrate with nitrogen gas and then is processed under an ultraviolet ozone condition for 20 min, and thus a pretreated FTO transparent conductive substrate is obtained.

In step 2, urea ($CO(NH_2)_2$) with a concentration of 12.5 milligrams per milliliter (mg/mL), hydrochloric acid (HCl) with a concentration of 12.5 microliters per milliliter (μL/mL), thioglycolic acid ($C_2H_4O_2S$) with a concentration of 0.25 μL/mL, and tin (II) chloride dihydrate ($SnCl_2 \cdot 2H_2O$) with a concentration of 2.75 mg/mL are will-mixed in the deionized water to obtain a precursor solution. The pretreated FTO transparent conductive substrate is submerged in the precursor solution, and a temperature of 90 Celsius degree (° C.) is kept for 5.5 hours (h) to deposit a tin dioxide electron transport layer to thus obtain a cell substrate. The ultrasonic cleaning process is performed on the cell substrate sequentially in the deionized water and the ethanol solution for 3 min, and blow-drying is performed on the cell substrate with the nitrogen gas and is performed an annealing treatment in air at a temperature of 170° C. for 60 min to prepared the electron transport layer with a thickness of 40 nm.

In step 3, a preparation method of the crystal of formamidine lead iodine ($FAPbI_3$) is as follows. 1.5 moles (mol) of lead acetate (($CH_3COO)_2Pb$) and 2 mol of formamidine acetate ($C_3H_8N_2O_2$) are mixed and added in 5 milliliters (mL) of hydroiodic acid (HI) aqueous solution with a concentration of 57 weight percent (wt %), a temperature of 80° C. is kept for 3 h to obtain a black $FAPbI_3$ powder, and a washing treatment and an annealing treatment are performed on the black $FAPbI_3$ powder to obtain the $FAPbI_3$ crystal; and a temperature of the annealing treatment is 150° C., and a period of the annealing treatment is 18 h.

The $FAPbI_3$ crystal, methylammonium chloride (MACl), and sulfamide are dissolved according to a mole ratio of 1:0.35:0.04, in a mixed solvent of N, N-dimethylformamide ($C_3H_7NO$) and dimethyl sulfoxide ($C_2H_6OS$) (a volume ratio of the N, N-dimethylformamide, and dimethyl sulfoxide is 4:1) to obtain a precursor solution, and stirred at a temperature of 40° C. for 4 h, specifically, a concentration of the $FAPbI_3$ is 1.8 moles per liter (mol/L). Inside a nitrogen-protected glove box, the pipette is used to transfer 70 μL of the prepared precursor solution, and the prepared precursor solution is evenly spin-coated on the electron transport layer prepared in step 2 by a spin coater; specifically, a speed for spin coating the precursor solution is 6000 revolutions per minute (rpm), a period for spin coating the precursor solution is 50 seconds (s), and 800 μL of ether ($C_2H_5OC_2H_5$) antisolvent is added when the spin coating is performed for 10 s. And after spin coating, an annealing treatment is performed at a temperature of 150° C. for 10 min in a nitrogen atmosphere to prepare and obtain a perovskite film with directional arrangement of intrinsic dipoles, and a thickness of the perovskite film is 560 nm.

In step 4, 90 milligrams (mg) of 2,2',7,7'-tetrakis-[N,N-di-(4-methoxyphenyl) amino]-9,9'-spirobifluorene (spiro-OMeTAD), 39 μL of 4-tert butyl pyridine ($C_9H_{13}N$), 23 μL of a solution of lithium bis(trifluoromethanesulfonyl)imide ($LiN(SO_2CF_3)_2$) in acetonitrile (a weight concentration is 520 mg/mL), 10 μL of a solution of [4-tert-butyl-2-(1H-pyrazole-1-yl) pyridine] cobalt (III) ($Co(C_{12}H_{15}N_3)_3$) in acetonitrile (a weight concentration is 375 mg/mL), and 1 mL of chlorobenzene ($C_6H_5Cl$) solution are mixed and stirred at a room temperature for 12 h to obtain a doped spiro-OMeTAD solution. And the doped spiro-OMeTAD solution is spin coated in a surface of the perovskite film with directional arrangement of intrinsic dipoles, and dried to obtain a hole transport layer, a speed for spin coating the doped spiro-OMeTAD solution is 3500 rpm, a period for spin coating the doped spiro-OMeTAD solution is 25 s, and a thickness of a prepared hole transport layer is 200 nm.

In step 5, a silver (Ag) electrode layer with a thickness of 120 nm is deposited on the hole transport layer by evaporating with an evaporation rate of 0.1-0.8 angstroms per second (Å/s) under a vacuum degree smaller than $1 \times 10^{-4}$ pascal (Pa), to fabricating an organic-inorganic perovskite solar cell with directional arrangement of intrinsic perovskite dipoles.

A scanning electron microscope (SEM) diagram of a perovskite film with directional arrangement of intrinsic dipoles prepared in step 3 of the embodiment 1 is shown in (c) of FIG. 1. As shown in (a)-(d) of FIG. 1, an organic-inorganic perovskite added with the sulfamide shows a uniform morphology, and shows an increasing grain size compared to a comparative embodiment 1.

Figure 2:
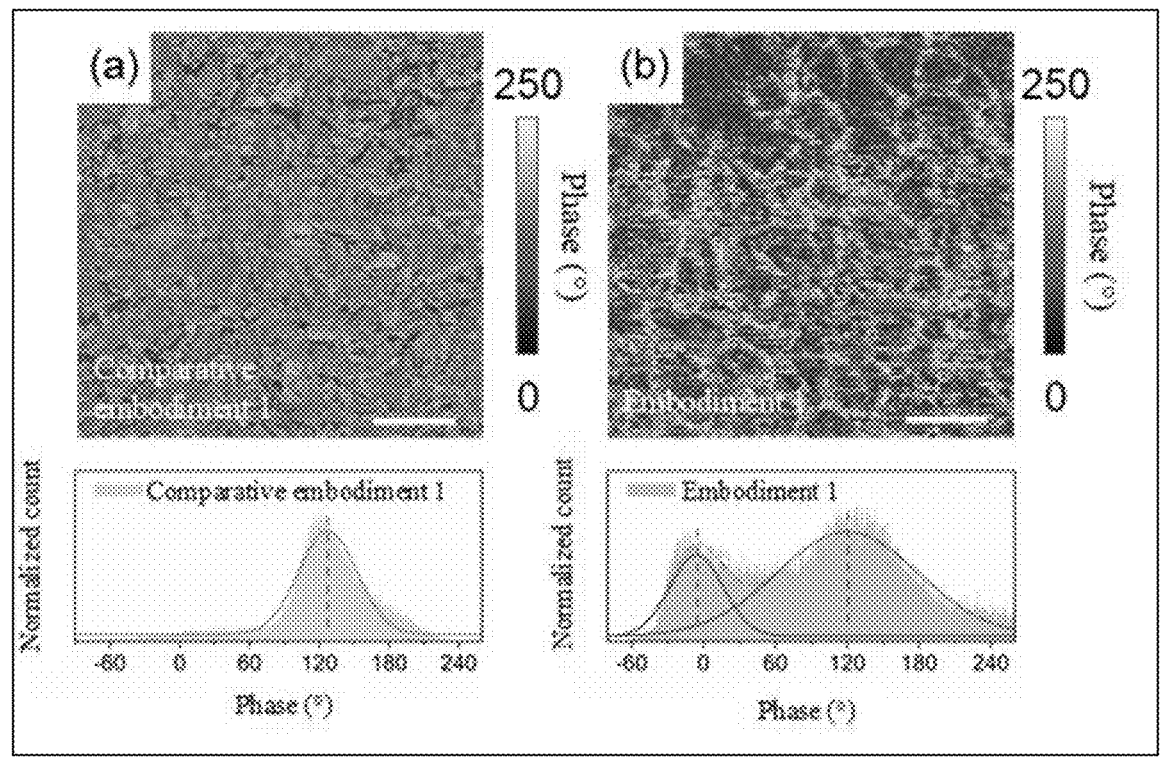
FIG. 2 illustrates phase diagrams of a piezoelectric force microscope (PFM) of organic-inorganic perovskite films, in which (a) and (b) respectively correspond to the organic-inorganic perovskite films prepared in the comparative embodiment and the embodiment 1 of the disclosure, and a length of the scale is 2 microns (m).

A phase diagram of a piezoelectric force microscope (PFM) of the perovskite film with directional arrangement of intrinsic dipoles prepared in the step 3 of the embodiment 1 is shown in (b) of FIG. 2. From a phase distribution in (a)-(b) of FIG. 2, it can be seen that compared to a single distribution of phase for the comparative embodiment 1, an internal area of the grain of the organic-inorganic perovskite modified by the sulfamide shows an additional polarization of vertical orientation.

Figure 3:
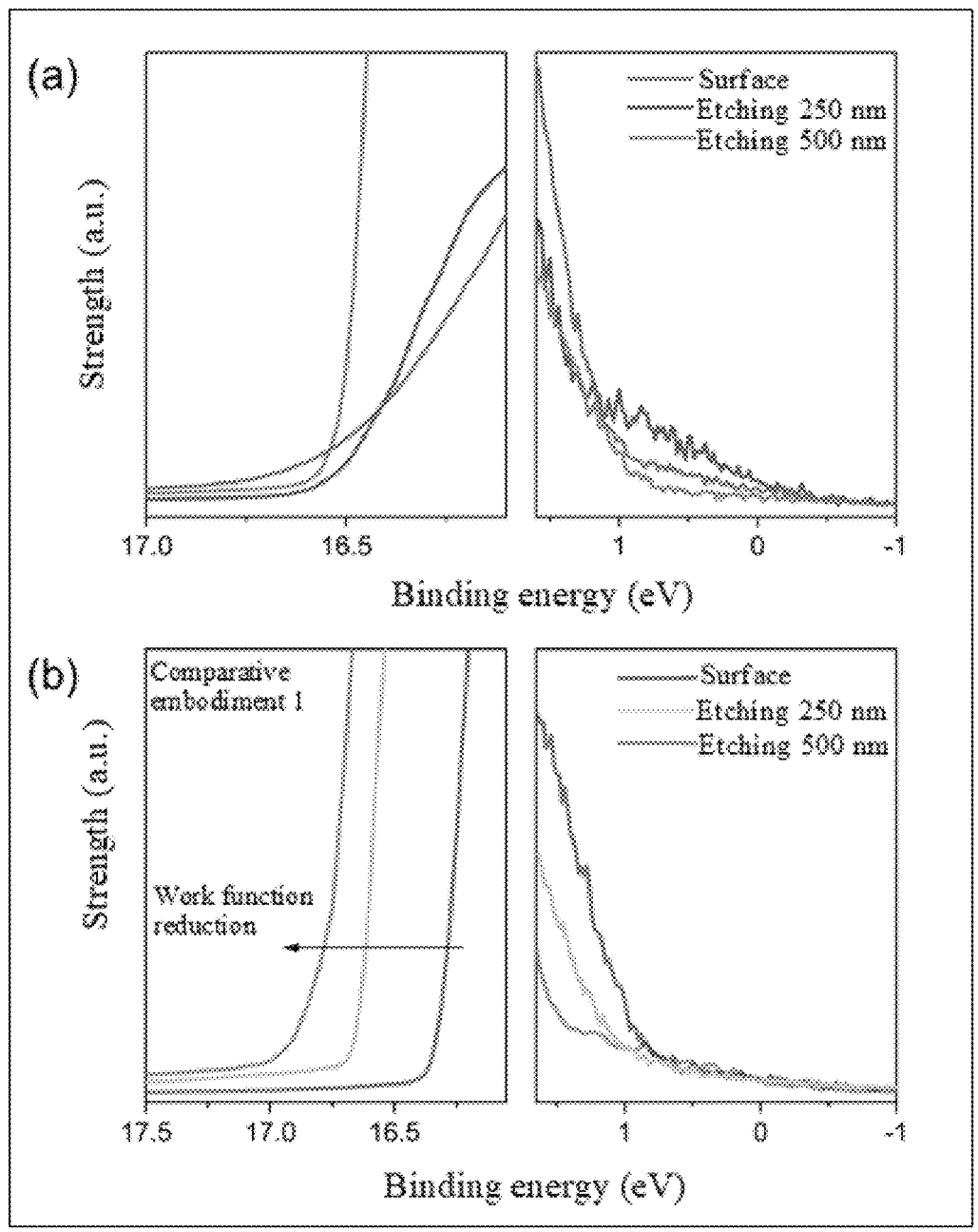
FIG. 3 illustrates ultraviolet photoelectron spectroscopies (UPS) of organic-inorganic perovskite films, in which (a) and (b) respectively correspond to the organic-inorganic perovskite films prepared in the comparative embodiment 1 and the embodiment 1 of the disclosure at different depths.

An ultraviolet photoelectron spectroscopy (UPS) of the perovskite film with directional arrangement of intrinsic dipoles prepared in the step 3 of the embodiment 1 is shown in (b) of FIG. 3. With an increase of depth, that closes to the electron transport layer, a work function of the perovskite film is gradually decreasing. The perovskite film with directional arrangement of intrinsic dipoles is provided with a transition from a p-type semiconductor to a n-type semiconductor, which shows a gradient energy band structure, however, a perovskite film prepared in the comparative embodiment 1 shows a similar energy band structure in different depths.

Figure 4:
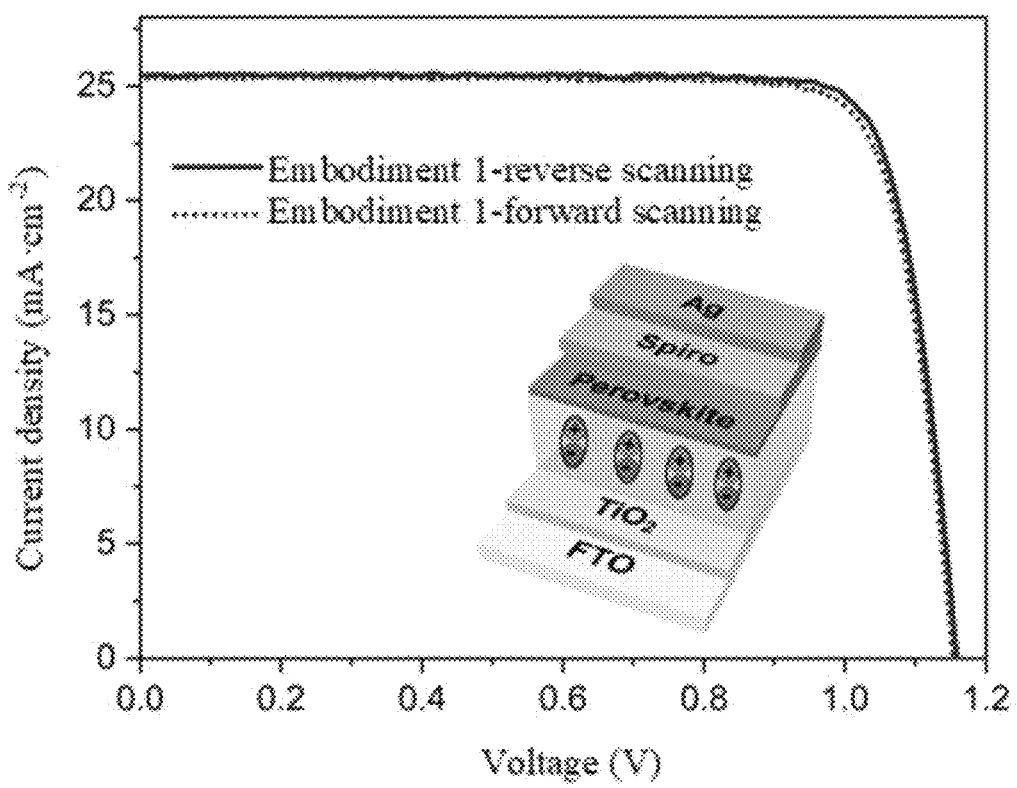
FIG. 4 illustrates schematic diagrams of a structure model and a current density-voltage curve of a solar cell prepared in the embodiment 1 of the disclosure.

A structure and a current density-voltage curve of a solar cell prepared in the embodiment 1 are as shown in FIG. 4, in a standard testing condition (lighting with air mass (AM) 1.5), and in a reverse scanning of a cell device with directional arrangement of dipoles, a photoelectric conversion efficiency is 24.63 percent (%), an open current voltage is 1.159 volts (V), a short circuit current is 25.46 milliamperes per square centimeter ($mA/cm^2$), and a fill factor is 83.48%; in a forward scanning, the photoelectric conversion efficiency is 24.17%, the open current voltage is 1.153 V, the short circuit current is 25.34 $mA/cm^2$, and the fill factor is 82.71%. Significantly increased compared to the comparative embodiment 1.

Figure 5:
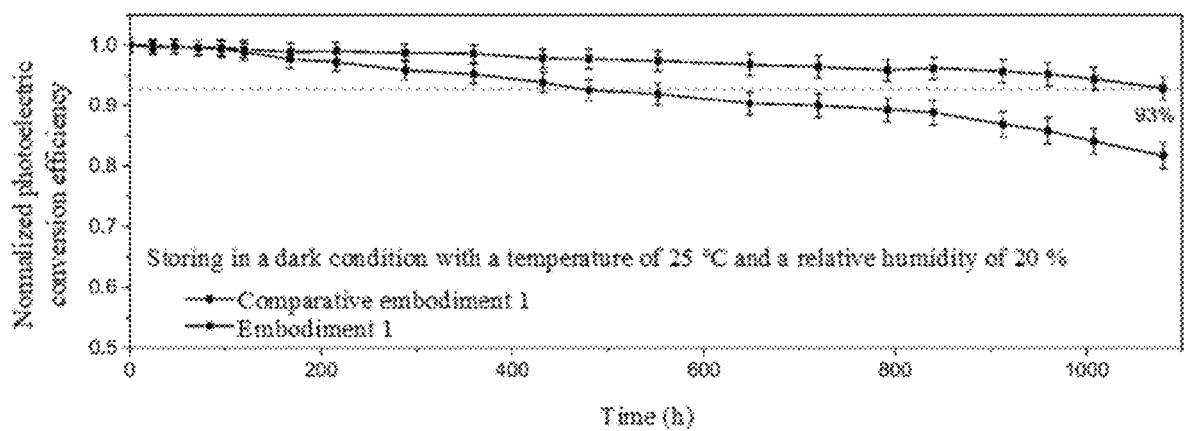
FIG. 5 illustrates a schematic diagram showing stability tests of solar cells prepared in the embodiment 1 and solar cells prepared in the comparative embodiment 1 of the disclosure.

A stability test result of perovskite solar cells without encapsulation prepared in the embodiment 1 is shown in FIG. 5. After storing at a temperature of 25° C., a relative humidity of 20%, an air environment, and a dark condition for 1080 h, the perovskite solar cells without encapsulation can maintain an initial efficiency of over 93%, significantly improved compared to the comparative embodiment 1.

Embodiment 2

A preparation method of organic-inorganic perovskite solar cell with directional arrangement of intrinsic perovskite dipoles is described in the embodiment 1, the difference is that the step 2 is omitted, that is the perovskite film with directional arrangement of intrinsic dipoles is directly deposited on the pretreated FTO transparent conductive substrate.

Other steps and conditions are consistent with the embodiment 1.

Figure 6:
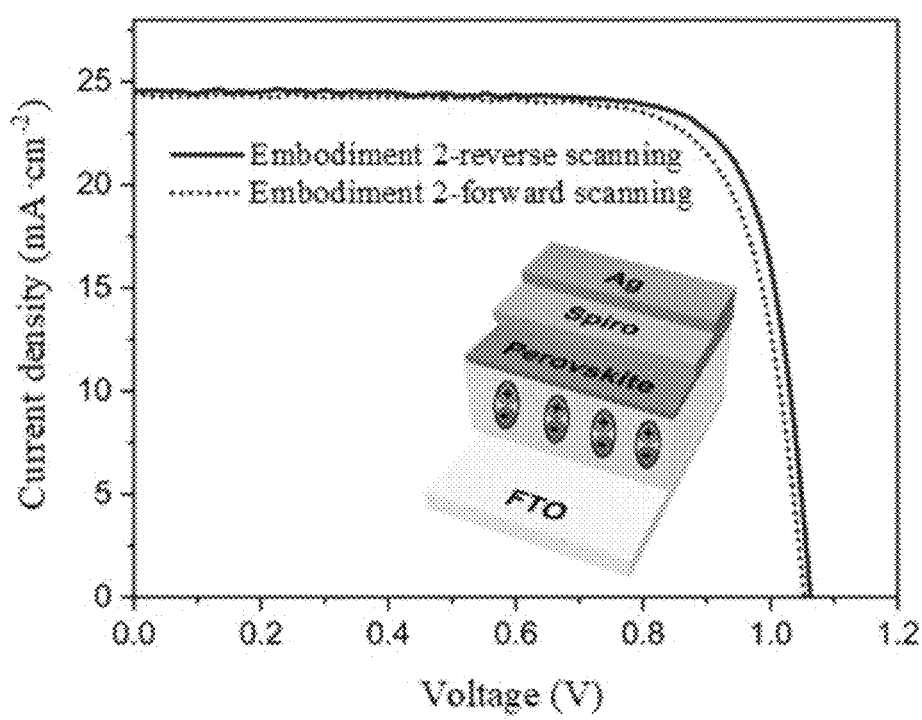
FIG. 6 illustrates schematic diagrams of a structure model and a current density-voltage curve of a solar cell prepared in an embodiment 2 of the disclosure.

A structure and a current density-voltage curve of a solar cell prepared in the embodiment 2 are shown in FIG. 6, in the standard testing condition (lighting with AM 1.5), and in a situation of reverse scanning of the cell device with directional arrangement of dipoles, the photoelectric conversion efficiency is 20.37%, the open current voltage is 1.063 V, the short circuit current is 24.58 mA/cm$^2$, and the fill factor is 77.95%; in a situation of forward scanning, the photoelectric conversion efficiency is 19.56%, the open current voltage is 1.054 V, the short circuit current is 24.36 mA/cm$^2$, and the fill factor is 76.18%, which is one of the highest efficiencies of perovskite solar cells without the electron transport layer reported currently.

Figure 7:
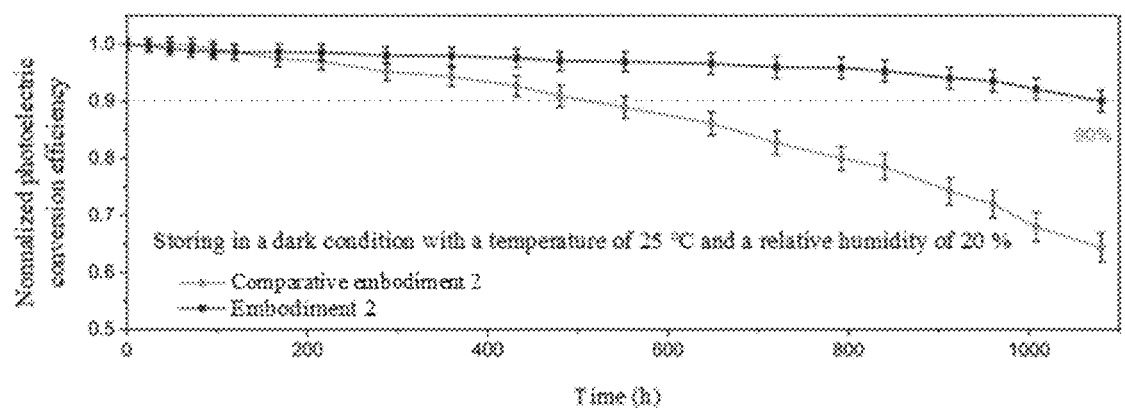
FIG. 7 illustrates a schematic diagram showing stability test results for solar cells prepared in the embodiment 2 and solar cells prepared in a comparative embodiment 2 of the disclosure.

A stability test result of perovskite solar cells without encapsulation prepared in the embodiment 1 is shown in FIG. 7. After storing at a temperature of 25° C., a relative humidity of 20%, an air environment, and a dark condition for 1080 h, the perovskite solar cells without encapsulation can maintain an initial efficiency of over 90%, significantly improved of device stability compared to a comparative embodiment 2.

It is noted that the perovskite film prepared in the embodiment 2 is the same as the embodiment 1, a polarization of the perovskite film and relative information of the energy band are the same as the embodiment 1, and no further repetition of the narrative.

Embodiment 3

A preparation method of organic-inorganic perovskite solar cell with directional arrangement of intrinsic perovskite dipoles is described in the embodiment 1, it is different in step 3 in that, the FAPbI$_3$ crystal, the MACl, and the sulfamide are dissolved according to a mole ratio of 1:0.35:0.02, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, a concentration of the FAPbI$_3$ is 1.8 mol/L. Inside a nitrogen-protected glove box, the pipette is used to transfer 70 μL of the prepared precursor solution, and the prepared precursor solution is evenly spin-coated on the electron transport layer prepared in the step 2 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at a temperature of 150° C. for 10 min in the nitrogen atmosphere to prepare and obtain the perovskite film with directional arrangement of intrinsic dipoles.

Other steps and conditions are consistent with the embodiment 1.

A SEM diagram of a perovskite film with directional arrangement of intrinsic dipoles prepared in step 3 of the embodiment 3 is shown in (b) of FIG. 1. As shown in (a)-(d) of FIG. 1, an organic-inorganic perovskite modified by the sulfamide shows a uniform morphology, and shows an increasing grain size compared to the comparative embodiment 1.

A solar cell prepared in the embodiment 3 in the standard testing condition (lighting with AM 1.5), and in a situation of reverse scanning, the photoelectric conversion efficiency is 24.08%, the open current voltage is 1.141 V, the short circuit current is 25.42 mA/cm$^2$, and the fill factor is 83.02%; in a situation of forward scanning, the photoelectric conversion efficiency is 23.42%, the open current voltage is 1.137 V, the short circuit current is 25.26 mA/cm$^2$, and the fill factor is 81.54%. The photoelectric conversion efficiency is improved compared to the comparative embodiment 1, slightly decreased compared to the embodiment 1.

Embodiment 4

A preparation method of organic-inorganic perovskite solar cell with directional arrangement of intrinsic perovskite dipoles is described in the embodiment 1, it is different in step 3 in that, the FAPbI$_3$ crystal, the MACl, and the sulfamide are dissolved according to a mole ratio of 1:0.35:0.08, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, a concentration of the FAPbI$_3$ is 1.8 mol/L. Inside a nitrogen-protected glove box, the pipette is used to transfer 70 μL of the prepared precursor solution, and the prepared precursor solution is evenly spin-coated on the electron transport layer prepared in the step 2 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at a temperature of 150° C. for 10 min in the nitrogen atmosphere to prepare and obtain the perovskite film with directional arrangement of intrinsic dipoles.

Other steps and conditions are consistent with the embodiment 1.

A SEM diagram of a perovskite film with directional arrangement of intrinsic dipoles prepared in step 3 of the embodiment 4 is shown in (d) of FIG. 1. As shown in (a)-(d) of FIG. 1, an organic-inorganic perovskite modified by the sulfamide shows a uniform morphology, and shows an increasing grain size compared to the comparative embodiment 1.

A solar cell prepared in the embodiment 4 in the standard testing condition (lighting with AM 1.5), and in a situation of reverse scanning, the photoelectric conversion efficiency is 23.83%, the open current voltage is 1.138 V, the short circuit current is 25.31 mA/cm$^2$, and the fill factor is 82.74%; in a situation of forward scanning, the photoelectric conversion efficiency is 23.41%, the open current voltage is 1.132 V, the short circuit current is 25.25 mA/cm$^2$, and the fill factor is 81.90%. The photoelectric conversion efficiency is improved compared to the comparative embodiment 1, slightly decreased compared to the embodiment 1 and the embodiment 3.

Embodiment 5

A preparation method of organic-inorganic perovskite solar cell with directional arrangement of intrinsic perovskite dipoles is described in the embodiment 2, it is different in step 3 in that, the $FAPbI_3$ crystal, the MACl, and the sulfamide are dissolved according to a mole ratio of 1:0.35:0.02, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, a concentration of the $FAPbI_3$ is 1.8 mol/L. Inside a nitrogen-protected glove box, the pipette is used to transfer 70 μL of the prepared precursor solution, and the prepared precursor solution is evenly spin-coated on the FTO transparent conductive substrate pretreated in the step 1 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at a temperature of 150° C. for 10 min in the nitrogen atmosphere to prepare and obtain the perovskite film with directional arrangement of intrinsic dipoles.

Other steps and conditions are consistent with the embodiment 2.

A solar cell prepared in the embodiment 5 in the standard testing condition (lighting with AM 1.5), and in a situation of reverse scanning, the photoelectric conversion efficiency is 19.61%, the open current voltage is 1.043 V, the short circuit current is 24.44 mA/cm$^2$, and the fill factor is 76.92%; in a situation of forward scanning, the photoelectric conversion efficiency is 18.89%, the open current voltage is 1.035 V, the short circuit current is 24.21 mA/cm$^2$, and the fill factor is 75.37%. The photoelectric conversion efficiency is improved compared to the comparative embodiment 2, slightly decreased compared to the embodiment 2.

Embodiment 6

A preparation method of organic-inorganic perovskite solar cell with directional arrangement of intrinsic perovskite dipoles is described in the embodiment 2, it is different in step 3 in that, the$FAPbI_3$ crystal, the MACl, and the sulfamide are dissolved according to a mole ratio of 1:0.35:0.08, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, a concentration of the $FAPbI_3$ is 1.8 mol/L. Inside a nitrogen-protected glove box, the pipette is used to transfer 70 μL of the prepared precursor solution, and the prepared precursor solution is evenly spin-coated on the FTO transparent conductive substrate pretreated in the step 1 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at a temperature of 150° C. for 10 min in the nitrogen atmosphere to prepare and obtain the perovskite film with directional arrangement of intrinsic dipoles.

Other steps and conditions are consistent with the embodiment 2.

A solar cell prepared in the embodiment 6 in the standard testing condition (lighting with AM 1.5), and in a situation of reverse scanning, the photoelectric conversion efficiency is 18.99%, the open current voltage is 1.045 V, the short circuit current is 24.05 mA/cm$^2$, and the fill factor is 75.58%; in a situation of forward scanning, the photoelectric conversion efficiency is 18.29%, the open current voltage is 1.032 V, the short circuit current is 23.88 mA/cm$^2$, and the fill factor is 74.23%. The photoelectric conversion efficiency is improved compared to the comparative embodiment 2, slightly decreased compared to the embodiment 2 and the embodiment 5, and a hysteresis is slightly improved compared to the embodiment 5.

Embodiment 7

A preparation method of organic-inorganic perovskite solar cell with directional arrangement of intrinsic perovskite dipoles is described in the embodiment 1, it is different in step 3 in that the temperature of the annealing treatment of the perovskite film is changed. The $FAPbI_3$ crystal, the MACl, and the sulfamide are dissolved according to a mole ratio of 1:0.35:0.04, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, the concentration of the $FAPbI_3$ is 1.8 mol/L. Inside a nitrogen-protected glove box, the pipette is used to transfer 70 μL of the prepared precursor solution, and the prepared precursor solution is evenly spin-coated on the electron transport layer prepared in the step 2 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at a temperature of 100° C. for 15 min in the nitrogen atmosphere to prepare and obtain the perovskite film with directional arrangement of intrinsic dipoles.

Other steps and conditions are consistent with the embodiment 1.

A solar cell prepared in the embodiment 7 in the standard testing condition (lighting with AM 1.5), and in a situation of reverse scanning, the photoelectric conversion efficiency is 24.04%, the open current voltage is 1.139 V, the short circuit current is 25.45 mA/cm$^2$, and the fill factor is 82.93%; in a situation of forward scanning, the photoelectric conversion efficiency is 23.37%, the open current voltage is 1.134 V, the short circuit current is 25.28 mA/cm$^2$, and the fill factor is 81.52%. The photoelectric conversion efficiency is improved compared to the comparative embodiment 1, slightly decreased compared to the embodiment 1.

Embodiment 8

A preparation method of organic-inorganic perovskite solar cell with directional arrangement of intrinsic perovskite dipoles is described in the embodiment 2, it is different in step 3 in that the temperature of the annealing treatment of the perovskite film is changed. The $FAPbI_3$ crystal, the MACl, and the sulfamide are dissolved according to a mole ratio of 1:0.35:0.04, in the mixed solvent of N, N-dimethylformamide and dimethyl sulfoxide (the volume ratio of the N, N-dimethylformamide and dimethyl sulfoxide is 4:1) to obtain the precursor solution, and stirred at a temperature of 40° C. for 4 h, specifically, the concentration of the FAPbI$_3$ is 1.8 mol/L. Inside a nitrogen-protected glove box, the pipette is used to transfer 70 μL of the prepared precursor solution, and the prepared precursor solution is evenly spin-coated on the FTO transparent conductive substrate pretreated in the step 1 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at the temperature of 100° C. for 15 min in the nitrogen atmosphere to prepare and obtain the perovskite film with directional arrangement of intrinsic dipoles.

Other steps and conditions are consistent with the embodiment 2.

A solar cell prepared in the embodiment 8 in the standard testing condition (lighting with AM 1.5), and in a situation of reverse scanning, the photoelectric conversion efficiency is 19.74%, the open current voltage is 1.058 V, the short circuit current is 24.34 mA/cm$^2$, and the fill factor is 76.67%; in a situation of forward scanning, the photoelectric conversion efficiency is 18.98%, the open current voltage is 1.047 V, the short circuit current is 24.13 mA/cm$^2$, and the fill factor is 75.12%. The photoelectric conversion efficiency is improved compared to the comparative embodiment 2, slightly decreased compared to the embodiment 2.

Thus, the temperature of the annealing treatment of the perovskite film is an important factor in determining a volatilization rate of the sulfonamide, a reactivity of dipole redirection is improved by a high temperature for performing the annealing treatment, which is conducive to the directional arrangement of dipoles. However, an excessively high temperature for performing the annealing treatment is not conducive to a stability of organic compounds of the perovskite film, and a specific parameter for performing the annealing treatment of the perovskite film in the disclosure is to anneal at a temperature of 150° C. for 10 min.

Comparative Embodiment 1

A preparation method for organic-inorganic perovskite solar cell is described in the embodiment 1, it is different in step 3, the sulfamide is not added, that is: the FAPbI$_3$ crystal and the MACl are dissolved according to a mole ratio of 1:0.35, in the mixed solvent of N, N-dimethylformamide and dimethyl sulfoxide (the volume ratio of the N, N-dimethylformamide and dimethyl sulfoxide is 4:1) to obtain the precursor solution, and stirred at the temperature of 40° C. for 4 h, specifically, the concentration of the FAPbI$_3$ is 1.8 mol/L. Inside a nitrogen-protected glove box, the pipette is used to transfer 70 μL of the prepared precursor solution, and the prepared precursor solution is evenly spin-coated on the electron transport layer prepared in the step 2 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at the temperature of 150° C. for 10 min in the nitrogen atmosphere to prepare and obtain the perovskite film.

Other steps and conditions are consistent with the embodiment 1.

An SEM diagram of a perovskite film prepared in step 3 of the comparative embodiment 1 is shown in (a) of FIG. 1.

As shown in (a)-(d) of FIG. 1, a grain size of the organic-inorganic perovskite without the sulfamide is small and non-uniform.

A phase diagram of a PFM of the perovskite film prepared in the step 3 of the comparative embodiment 1 is shown in (a) of FIG. 2. From a phase distribution in (a)-(b) of FIG. 2, it can be seen that a phase distribution of the perovskite film is normal at 127 degrees (°).

A UPS of the perovskite film prepared in the step 3 of the comparative embodiment 1 is shown in (a) of FIG. 3. With a change of depth, the surface work function of the perovskite film and a band edge position remains basically unchanged, and shows a flat energy band structure.

A solar cell prepared in the comparative embodiment 1 in the standard testing condition (lighting with AM 1.5), in a situation of reverse scanning, the photoelectric conversion efficiency is 22.30%, the open current voltage is 1.102 V, the short circuit current is 25.03 mA/cm$^2$, and a fill factor is 80.84%; in a situation of forward scanning, the photoelectric conversion efficiency is 21.23%, the open current voltage is 1.087 V, the short circuit current is 24.80 mA/cm$^2$, and the fill factor is 78.77%.

A stability test result of perovskite solar cells without encapsulation prepared in the embodiment 1 is shown in FIG. 5. After storing at a temperature of 25° C., a relative humidity of 20%, an air environment, and a dark condition for 1080 h, the perovskite solar cells without encapsulation merely maintain an initial efficiency of 82%.

Comparative Embodiment 2

A preparation method for organic-inorganic perovskite solar cell is described in the embodiment 2, it is different in step 3, the sulfamide is not added, that is: the FAPbI$_3$ crystal, the MACl are dissolved according to a mole ratio of 1:0.35, in the mixed solvent of N, N-dimethylformamide and dimethyl sulfoxide (the volume ratio of the N, N-dimethylformamide and dimethyl sulfoxide is 4:1) to obtain the precursor solution, and stirred at the temperature of 40° C. for 4 h, specifically, the concentration of the FAPbI$_3$ is 1.8 mol/L. Inside a nitrogen-protected glove box, the pipette is used to transfer 70 μL of the prepared precursor solution, and the prepared precursor solution is evenly spin-coated on the FTO transparent conductive substrate pretreated in the step 1 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at the temperature of 150° C. for 10 min in the nitrogen atmosphere to prepare and obtain the perovskite film.

Other steps and conditions are consistent with the embodiment 2.

A solar cell prepared in the comparative embodiment 2 in the standard testing condition (lighting with AM 1.5), in a situation of reverse scanning, the photoelectric conversion efficiency is 16.00%, the open current voltage is 0.971 V, the short circuit current is 23.85 mA/cm$^2$, and a fill factor is 69.07%; in a situation of forward scanning, the photoelectric conversion efficiency is 12.61%, the open current voltage is 0.923 V, the short circuit current is 23.41 mA/cm$^2$, and the fill factor is 58.34%. The photoelectric conversion efficiency is significantly decreased compared to the embodiment 2, and the comparative document 2 has a serious hysteresis.

A stability test result of perovskite solar cells without encapsulation prepared in the embodiment 1 is shown in FIG. 5. After storing at a temperature of 25° C., a relative humidity of 20%, an air environment, and a dark condition for 1080 h, the perovskite solar cells without encapsulation merely maintain an initial efficiency of 64%, and a loss of the photoelectric conversion efficiency is serious.

Comparative Embodiment 3

A preparation method for organic-inorganic perovskite solar cell is described in the embodiment 1, it is different in step 3, sulfonamide analogue is introduced, that is: the FAPbI$_3$ crystal, the MACl, and 3,4-difluorobenzene sulfonamide (C$_6$H$_5$F$_2$NO$_2$S) are dissolved according to a mole ratio of 1:0.35:0.04, in the mixed solvent of N, N-dimethylformamide and dimethyl sulfoxide (the volume ratio of the N, N-dimethylformamide and dimethyl sulfoxide is 4:1) to obtain the precursor solution, and stirred at the temperature of 40° C. for 4 h, specifically, the concentration of the FAPbI$_3$ is 1.8 mol/L. Inside a nitrogen-protected glove box, the pipette is used to transfer 70 μL of the prepared precursor solution, and the prepared precursor solution is evenly spin-coated on the electron transport layer prepared in the step 2 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at the temperature of 150° C. for 10 min in the nitrogen atmosphere to prepare and obtain the perovskite film.

The 3,4-difluorobenzene sulfonamide used in step 3 of the comparative embodiment 3 has a similar functional group with the sulfamide used in the disclosure, and the 3,4-difluorobenzene sulfonamide is used as a reference in the comparative embodiment 3 to study an effect of the sulfonamide analogue to the perovskite solar cell.

Other steps and conditions are consistent with the embodiment 1.

A solar cell prepared in the comparative embodiment 3 in the standard testing condition (lighting with AM 1.5), in a situation of reverse scanning, the photoelectric conversion efficiency is 23.68%, the open current voltage is 1.133 V, the short circuit current is 25.35 mA/cm$^2$, and a fill factor is 82.45%; in a situation of forward scanning, the photoelectric conversion efficiency is 22.76%, the open current voltage is 1.125 V, the short circuit current is 25.23 mA/cm$^2$, and the fill factor is 80.18%. The photoelectric conversion efficiency is smaller than the photoelectric conversion efficiency of the solar cell in the embodiment 1, and the comparative document 3 has a specific hysteresis compared to the embodiment 1.

Comparative Embodiment 4

A preparation method for organic-inorganic perovskite solar cell is described in the embodiment 2, it is different in step 3, the sulfonamide analogue is introduced, that is: the FAPbI$_3$ crystal, the MACl, and the 3,4-difluorobenzene sulfonamide (C$_6$H$_5$F$_2$NO$_2$S) are dissolved according to a mole ratio of 1:0.35:0.04, in the mixed solvent of N, N-dimethylformamide and dimethyl sulfoxide (the volume ratio of the N, N-dimethylformamide and dimethyl sulfoxide is 4:1) to obtain the precursor solution, and stirred at the temperature of 40° C. for 4 h, specifically, the concentration of the FAPbI$_3$ is 1.8 mol/L. Inside a nitrogen-protected glove box, the pipette is used to transfer 70 μL of the prepared precursor solution, and the prepared precursor solution is evenly spin-coated on the FTO transparent conductive substrate pretreated in the step 1 by the spin coater; specifically, the speed for spin coating the precursor solution is 6000 rpm, the period for spin coating the precursor solution is 50 s, and 800 μL of the ether antisolvent is added when the spin coating is performed for 10 s. And after spin coating, the annealing treatment is performed at the temperature of 150° C. for 10 min in the nitrogen atmosphere to prepare and obtain the perovskite film.

The 3,4-difluorobenzene sulfonamide used in step 3 of the comparative embodiment 4 has a similar functional group with the sulfamide used in the disclosure, and the 3,4-difluorobenzene sulfonamide is used as a reference in the comparative embodiment 4 to study an effect of the sulfonamide analogue to the perovskite solar cell.

Other steps and conditions are consistent with the embodiment 2.

A solar cell prepared in the comparative embodiment 4 in the standard testing condition (lighting with AM 1.5), in a situation of reverse scanning, the photoelectric conversion efficiency is 17.93%, the open current voltage is 1.013 V, the short circuit current is 24.55 mA/cm$^2$, and a fill factor is 72.10%; in a situation of forward scanning, the photoelectric conversion efficiency is 14.75%, the open current voltage is 0.957 V, the short circuit current is 23.96 mA/cm$^2$, and the fill factor is 64.33%. The photoelectric conversion efficiency is smaller than the photoelectric conversion efficiency of the solar cell in the embodiment 2, and the comparative document 4 has a serious hysteresis.

Thus, the 3,4-difluorobenzene sulfonamide is used as an additive introduced to the perovskite film, an improvement of performance is due to passivation of defects by coordination interaction between the functional groups such as S=O and a lead ion (Pb+) of the perovskite, however, an effect of the 3,4-difluorobenzene sulfonamide to the energy band structure is negligible, an energy level mismatch is not mitigated, which cause the photoelectric conversion efficiency of the device without the electron transport layer is still low, and inefficient carrier transportation causing the serious hysteresis.

What is claimed is:
1. A preparation method of an organic-inorganic perovskite solar cell with directional arrangement of intrinsic perovskite dipoles, the preparation method comprising:
   step 1: pretreating a conductive substrate;
   step 2: preparing an electron transport layer on the conductive substrate, and preparing a perovskite film with directional arrangement of intrinsic dipoles on the electron transport layer; or directly preparing a perovskite film with directional arrangement of intrinsic dipoles on the conductive substrate;
   step 3: preparing a hole transport layer on the perovskite film with directional arrangement of intrinsic dipoles; and
   step 4: preparing a metal counter electrode on the hole transport layer, to thereby obtain the organic-inorganic perovskite solar cell with directional arrangement of intrinsic perovskite dipoles comprising the conductive substrate, the electron transport layer, the perovskite film with directional arrangement of intrinsic dipoles, the hole transport layer, and the metal counter electrode, which are sequentially arranged from bottom to top, or obtain the organic-inorganic perovskite solar cell with directional arrangement of intrinsic perovskite dipoles comprising the conductive substrate, the perovskite film with directional arrangement of intrinsic dipoles, the hole transport layer, and the metal counter electrode, which are sequentially arranged from bottom to top;

wherein when the organic-inorganic perovskite solar cell with directional arrangement of intrinsic perovskite dipoles comprises the conductive substrate, the electron transport layer, the perovskite film with directional arrangement of intrinsic dipoles, the hole transport layer, and the metal counter electrode, which are sequentially arranged from bottom to top, the perovskite film with directional arrangement of intrinsic dipoles is prepared by a process I comprising: adding sulfamide ($SO_2(NH_2)_2$) into a precursor solution of perovskite and mixing to obtain a spin-coating solution, spin coating the spin-coating solution in the electron transport layer, and performing a first annealing treatment to obtain the perovskite film with directional arrangement of intrinsic dipoles; and wherein when the organic-inorganic perovskite solar cell with directional arrangement of intrinsic perovskite dipoles comprises the conductive substrate, the perovskite film with directional arrangement of intrinsic dipoles, the hole transport layer, and the metal counter electrode, which are sequentially arranged from bottom to top, the perovskite film with directional arrangement of intrinsic dipoles is prepared by a process II comprising: adding $SO_2(NH_2)_2$ into a precursor solution of perovskite and mixing to obtain a spin-coating solution, spin coating the spin-coating solution in the conductive substrate, and performing a first annealing treatment to obtain the perovskite film with directional arrangement of intrinsic dipoles.

2. The preparation method of the organic-inorganic perovskite solar cell with directional arrangement of intrinsic perovskite dipoles as claimed in claim 1, wherein at least one of the following conditions is satisfied:

in the step 1, a method for the pretreating the conductive substrate comprises: sequentially performing an ultrasonic cleaning process of the conductive substrate in deionized water, isopropanol ($C_3H_8O$) and ethanol ($CH_3CH_2OH$), and performing blow-drying with nitrogen; and performing an ultraviolet ozone treatment on the conductive substrate; wherein a period of the ultrasonic cleaning process for each of the deionized water, the $C_3H_8O$ and the $CH_3CH_2OH$ is in a range of 10-20 minutes (min), and a period of the ultraviolet ozone treatment is in a range of 10-30 min;

in the step 2, a method for the preparing the electron transport layer on the conductive substrate comprises: submerging the conductive substrate in a mixed aqueous solution of hydrochloric acid (HCl), urea ($CO(NH_2)_2$), thioglycolic acid ($C_2H_4O_2S$) and tin(II) chloride dihydrate ($SnCl_2 \cdot 2H_2O$), and performing a washing treatment, a drying treatment and a third annealing treatment to obtain the electron transport layer; wherein in the mixed aqueous solution, a concentration of the $CO(NH_2)_2$ is in a range of 12-13 milligrams per milliliter (mg/mL), a concentration of the HCl is in a range of 12-13 microliters per milliliter (μL/mL) and with a mass fraction of the HCl is 37 weight percent (wt %), a concentration of the $C_2H_4O_2S$ is in a range of 0.2-0.3 μL/mL, and a concentration of the $SnCl_2 \cdot 2H_2O$ is in a range of 2.5-3 mg/mL; a temperature for the submerging is in a range of 85-95 degrees Celsius (° C.), a period for the submerging is in a range of 5-6 hours (h), a temperature of the third annealing treatment is in a range of 160-180° C., a period of the third annealing treatment is in a range of 30-60 min, and an atmosphere of the third annealing treatment is air;

in the step 3, a method for the preparing the hole transport layer comprises: mixing 2,2',7,7'-tetrakis[N,N-di(4-methoxyphenyl) amino]-9,9'-spirobifluorene (spiro-OMeTAD), chlorobenzene ($C_6H_5Cl$), 4-tert-butylpyridine ($C_9H_{13}N$), a solution of lithium bis (trifluoromethanesulfonyl)imide ($LiN(SO_2CF_3)_2$) in acetonitrile ($CH_3CN$), and a solution of [4-tert-butyl-2-(1H-pyrazole-1-yl) pyridine] cobalt (III) ($Co(C_{12}H_{15}N_3)_3$) in $CH_3CN$ and performing stirring for dissolving to obtain a doped spiro-OMeTAD solution, spin coating the doped spiro-OMeTAD solution on the perovskite film with directional arrangement of intrinsic dipoles, and drying the doped spiro-OMeTAD solution to obtain the hole transport layer; and a ratio of a mass of the spiro-OMeTAD and a volume of the $C_6H_5Cl$ is 90:1 mg/mL, a concentration of the solution of $LiN(SO_2CF_3)_2$ in $CH_3CN$ is in a range of 500-540 mg/mL, a concentration of the solution of $Co(C_{12}H_{15}N_3)_3$ in $CH_3CN$ is in a range of 350-400 mg/mL, a volume ratio of the $C_6H_5Cl$:the $C_9H_{13}N$:the solution of $LiN(SO_2CF_3)_2$ in $CH_3CN$: the solution of $Co(C_{12}H_{15}N_3)_3$ in $CH_3CN$ is 1000:39:23:10; a speed for spin coating the doped spiro-OMeTAD solution is in a range of 3000-4000 revolutions per minute (rpm), and a period for spin coating the doped spiro-OMeTAD solution is in a range of 20-30 seconds (s); or in the step 4, a method for the preparing the metal counter electrode on the hole transport layer comprises depositing the metal counter electrode on the hole transport later by using a thermal evaporation with an evaporation rate of 0.1-0.8 angstroms per second (Å/s) under a vacuum degree being smaller than $1 \times 10^{-4}$ pascals (Pa).

3. The preparation method of the organic-inorganic perovskite solar cell with directional arrangement of intrinsic perovskite dipoles as claimed in claim 1, wherein at least one of the following conditions is satisfied:

the conductive substrate is a transparent conductive substrate with fluorine-doped tin oxide (FTO), and a thickness of the conductive substrate is in a range of 140-160 nanometers (nm);

a material of the electron transport layer is tin dioxide ($SnO_2$), and a thickness of the electron transport layer is in a range of 30-50 nm;

a material of the hole transport layer is spiro-OMeTAD, and a thickness of the hole transport layer is in a range of 200-250 nm; or the metal counter electrode is a silver (Ag) counter electrode, and a thickness of the metal counter electrode is in a range of 100-140 nm.

4. The preparation method of the organic-inorganic perovskite solar cell with directional arrangement of intrinsic perovskite dipoles as claimed in claim 1, wherein a thickness of the perovskite film with directional arrangement of intrinsic dipoles is in a range of 550-600 nm, the perovskite film with directional arrangement of intrinsic dipoles has a gradient energy band structure, and transits from a p-type semiconductor to a n-type semiconductor from top to bottom in the gradient energy band structure.

5. The preparation method of the organic-inorganic perovskite solar cell with directional arrangement of intrinsic perovskite dipoles as claimed in claim 1, wherein the precursor solution of perovskite is prepared by a process III comprising dissolving a crystal of formamidinium lead iodide ($FAPbI_3$) powder and methylammonium chloride (MACl) in a mixed solvent of N, N-dimethylformamide ($C_3H_7NO$) and dimethyl sulfoxide ($C_2H_6OS$) to obtain the precursor solution of perovskite, wherein a mole ratio of the $FAPbI_3$ powder and the MACl is 1:0.35; in the mixed solvent, a volume ratio of the $C_3H_7NO$ and the $C_2H_6OS$ is 3-5:1; and a concentration of the $FAPbI_3$ powder in the mixed solvent is in a range of 1.6-1.8 moles per liter (mol/L); and wherein the crystal of the $FAPbI_3$ powder is prepared by a process IV comprising mixing lead acetate (($CH_3COO)_2Pb$) with formamidine acetate ($C_3H_8N_2O_2$) in a mole ratio of 3:4 and adding into hydroiodic acid (HI) aqueous solution, keeping a temperature of 80-90° C. for 2-4 h, and performing a washing treatment and a second annealing treatment to obtain the crystal of the $FAPbI_3$ powder; and a concentration of the HI aqueous solution is in a range of 55-58 wt %, a temperature of the second annealing treatment is in a range of 150-180° C., and a period of the second annealing treatment is in a range of 12-24 h.

6. The preparation method of the organic-inorganic perovskite solar cell with directional arrangement of intrinsic perovskite dipoles as claimed in claim 1, wherein a mole ratio of the $SO_2(NH_2)_2$ and the $FAPbI_3$ in the precursor solution of perovskite is 0.02-0.08:1.

7. The preparation method of the organic-inorganic perovskite solar cell with directional arrangement of intrinsic perovskite dipoles as claimed in claim 6, wherein the mole ratio of the $SO_2(NH_2)_2$ and the $FAPbI_3$ in the precursor solution of perovskite is 0.04:1.

8. The preparation method of the organic-inorganic perovskite solar cell with directional arrangement of intrinsic perovskite dipoles as claimed in claim 1, wherein in the process I, a speed for spin coating the spin-coating solution is in a range of 5000-6000 rpm, and a period for spin coating the spin-coating solution is in a range of 40-50 s; and in the process II, a speed for spin coating the spin-coating solution is in a range of 5000-6000 rpm, and a period for spin coating the spin-coating solution is in a range of 40-50 s; and wherein in the process I, an ether ($C_2H_5OC_2H_5$) antisolvent is added when the spin coating is performed for 10 s, and a volume ratio of the $C_2H_5OC_2H_5$ antisolvent and the spin-coating solution is 10-13:1; and in the process II, a $C_2H_5OC_2H_5$ antisolvent is added when the spin coating is performed for 10 s, and a volume ratio of the $C_2H_5OC_2H_5$ antisolvent and the spin-coating solution is 10-13:1.

9. The preparation method of the organic-inorganic perovskite solar cell with directional arrangement of intrinsic perovskite dipoles as claimed in claim 1, wherein in process I, a temperature of the first annealing treatment is in a range of 100-160° C., and a period of the first annealing treatment is in a range of 10-15 min, and in the process II, a temperature of the first annealing treatment is in a range of 100-160° C., and a period of the first annealing treatment is in a range of 10-15 min.

10. The preparation method of the organic-inorganic perovskite solar cell with directional arrangement of intrinsic perovskite dipoles as claimed in claim 9, wherein in process I, the temperature of the first annealing treatment is in a range of 140-160° C.; and in the process II, the temperature of the first annealing treatment is in a range of 140-160° C.

11. The preparation method of the organic-inorganic perovskite solar cell with directional arrangement of intrinsic perovskite dipoles as claimed in claim 1, wherein in the process I, the spin coating and the first annealing treatment are performed in an atmosphere with a protective gas, and the protective gas is nitrogen; and in the process II, the spin coating and the first annealing treatment are performed in an atmosphere with a protective gas, and the protective gas is nitrogen.

12. The preparation method of the organic-inorganic perovskite solar cell with directional arrangement of intrinsic perovskite dipoles as claimed in claim 1, wherein the perovskite film with directional arrangement of intrinsic dipoles is a $FAPbI_3$ perovskite or a methylammonium lead iodide perovskite.

\* \* \* \* \*